(12) United States Patent  
Mack et al.

(10) Patent No.: US 8,289,095 B1
(45) Date of Patent: Oct. 16, 2012

(54) JITTER COMPENSATED NUMERICALLY CONTROLLED OSCILLATOR

(75) Inventors: Robert Mack, San Jose, CA (US); Timothy Jay Chen, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 41 days.

(21) Appl. No.: 13/041,145

(22) Filed: Mar. 4, 2011

Related U.S. Application Data

(63) Continuation of application No. 12/366,582, filed on Feb. 5, 2009, now Pat. No. 7,907,028.

(60) Provisional application No. 61/029,756, filed on Feb. 19, 2008.

(51) Int. Cl.
*H03L 1/00* (2006.01)
(52) U.S. Cl. ......... 331/175; 331/179; 327/106; 375/371
(58) Field of Classification Search .......... 327/105–107; 331/1 A, 172, 175, 176, 177 R, 179; 375/371
See application file for complete search history.

(56) References Cited

U.S. PATENT DOCUMENTS

| 4,108,035 | A | | 8/1978 | Alonso | |
|---|---|---|---|---|---|
| 5,640,416 | A | * | 6/1997 | Chalmers | 375/147 |
| 5,905,388 | A | * | 5/1999 | Van Der Valk et al. | 327/107 |
| 5,920,555 | A | * | 7/1999 | Hulbert | 370/342 |
| 6,259,727 | B1 | * | 7/2001 | Auer | 375/222 |
| 7,372,340 | B2 | * | 5/2008 | Xiu et al. | 331/45 |
| 7,570,725 | B1 | * | 8/2009 | Ciccone et al. | 375/371 |

* cited by examiner

*Primary Examiner* — Levi Gannon

(57) ABSTRACT

A method for compensating NCO jitter by changing a step value used to increment an accumulator in the NCO to make up for inaccuracies, or jitters. In one approach, a remainder in the accumulator may be monitored and a compensated clock close to the current edge of an ideal clock may be generated. In another approach, a compensated clock close to the next edge of the ideal clock may be generated after the current edge of the ideal clock is missed. The step value may be stored in a memory, which may be a register. A jitter compensator may include a comparator for monitoring the remainder in the accumulator or a detector for detecting whether an ideal clock has been missed. The jitter compensator may also change the step value to a step value for a faster clock to compensate jitter.

16 Claims, 9 Drawing Sheets

JITTER COMPENSATED NUMERICALLY CONTROLLED OSCILLATOR

CROSS REFERENCE TO RELATED APPLICATION

This application is a continuation of U.S. application Ser. No. 12/366,582, filed Feb. 5, 2009, which claims priority under 35 U.S.C. §119(e) to U.S. Provisional Application No. 61/029,756, filed Feb. 18, 2008. The disclosures of the applications referenced above are incorporated herein by reference.

BACKGROUND

1. Field of the Invention

The present invention relates generally to a numerically controlled oscillator (NCO), and more particularly to jitter compensation in a NCO.

2. Description of Related Art

An NCO may be used to generate a desired clock from a known clock when the ratio between the two clocks is not an exact integer, e.g., when a clock of 3.2 KHz needs to be generated from a clock of 32.768 KHz. FIG. 1A illustrates a prior art NCO. As shown, the NCO 100 may have a register 101 and an accumulator 102. The accumulator may have, e.g., 24 bits. The accumulator 102 may receive an input clock and may be incremented during each pulse of the input clock. The generated clock is the most significant bit (MSB) of the accumulator 102. A step used to increment the accumulator 102 may be stored in the register 101, and may be calculated by the following formula:

$$\text{Step} = 0x100\_0000 * \text{output\_frequency}/\text{input\_frequency} \quad (1)$$

When the value from 0x0 to 0x80_0000 of the accumulator 102 is the same, and the value from 0x80_0000 to 0x100_0000 of the accumulator 102 is the same, the NCO 100 may create a close-to 50% duty cycle clock that toggles high when the accumulator 102 is in the value ranging from 0x80_0000 to 0x100_0000, and toggles low when the accumulator 102 reaches its maximum value and wraps around. The value 0x100_0000 is used because two same edge toggles make up one clock period, hence 0x100_0000=0x80_0000*2.

When the frequency of an input clock is 11.38 KHz, the expected output frequency is 3.2 KHz, and a 5 bit accumulator is used, the step may be calculated as follows according to Equation (1):

$$\text{Step} = 32 * 3.2/11.38 \approx 9$$

For each cycle of the input clock, the accumulator 102 may be incremented by the step from the register 101. The clock at the output of the accumulator 102 may become high when the accumulator value reaches 16, which is the 0x80_0000 value and a MSB threshold, and may become low when the accumulator value exceeds 31, which is the 0x100_0000 value or the maximum value of the accumulator 102.

FIG. 1B illustrates a signal timing reference chart of a prior art NCO. As shown, at time 0, the register 101 has the step value 9, and the accumulator 102 has a value of binary 0. At time 1, or the first input clock pulse, the accumulator 102 may be incremented by the step value 9, and the accumulator value may become 9. Since it is lower than the MSB threshold 16, the MSB value of the accumulator 102 is still binary zero. At time 2, the accumulator 102 may be incremented by the step value 9 again, and its output may become 18. Since it exceeds the MSB threshold 16, the MSB value of the accumulator 102 may change to binary one. This binary one may continue until just before time 5. At time 5, the output of the accumulator 102 may change to 36 and exceed the maximum 31 of the accumulator 102. As a result, the MSB value of the accumulator 102 may drop to binary 0, with a remainder 5 left in the accumulator 102. Thus, at time 6, the beginning of the second cycle, the accumulator 102 may start from the value 5, instead of the value 0 at time 0. The remainder may cause offsets between a reference MSB and the actual MSB, or jitters, as shown in FIG. 1B. From cycle to cycle, the NCO edges may jitter up to 1 full period of the input clock, e.g., 11.38 kHz in the example shown in FIG. 1B.

Thus, the NCO does not create a perfect clock, but a clock that has the correct frequency on average. It may be desirable to provide a method and apparatus for reducing NCO jitter.

SUMMARY

A method and apparatus for compensating jitter in a NCO by changing a step value used to increment an accumulator in the NCO to make up for inaccuracies, or jitters. The method may comprise: receiving a first input clock and a first step value corresponding to the first input clock; incrementing an accumulator by the first step value during a pulse of the first input clock; and applying a second step value to the accumulator to reduce jitter.

In one approach, the method may comprise monitoring an accumulator value to adjust a current output of the NCO to a current edge of an ideal clock.

In another approach, the method may comprise determining whether a current output of the NCO misses a current edge of an ideal clock.

A jitter compensated NCO may comprise: a memory for storing a first step value for an input clock; an accumulator being incremented by the step value during a pulse of the input clock; and a jitter compensator for replacing a first step value in the memory with a second step value to reduce jitter.

The second step value may correspond to a second input clock.

The memory may be a register.

In one approach, the jitter compensator may comprise a comparator for monitoring an accumulator value so as to adjust a current output of the NCO to a current edge of an ideal clock.

In another approach, the jitter compensator may comprise a jitter detector for determining whether a current output of the NCO misses a current edge of an ideal clock, and a controller for generating the second step value to align a next output of the NCO with a next edge of the ideal clock.

BRIEF DESCRIPTION OF THE DRAWING FIGURES

Embodiments of the present invention are described herein with reference to the accompanying drawings, similar reference numbers being used to indicate functionally similar elements.

DETAILED DESCRIPTION

A method and apparatus for compensating NCO jitter by changing a step value used to increment an accumulator in the NCO to make up for inaccuracies, or jitters. In one approach, a remainder in the accumulator may be monitored and a compensated clock close to the current edge of an ideal clock may be generated. In another approach, a compensated clock close to the next edge of the ideal clock may be generated after the current edge of the ideal clock is missed. The invention may be carried out on a computer, using computer-executable instructions or in hardware. Advantages of the present invention will become apparent from the following detailed description.

Figure 2:
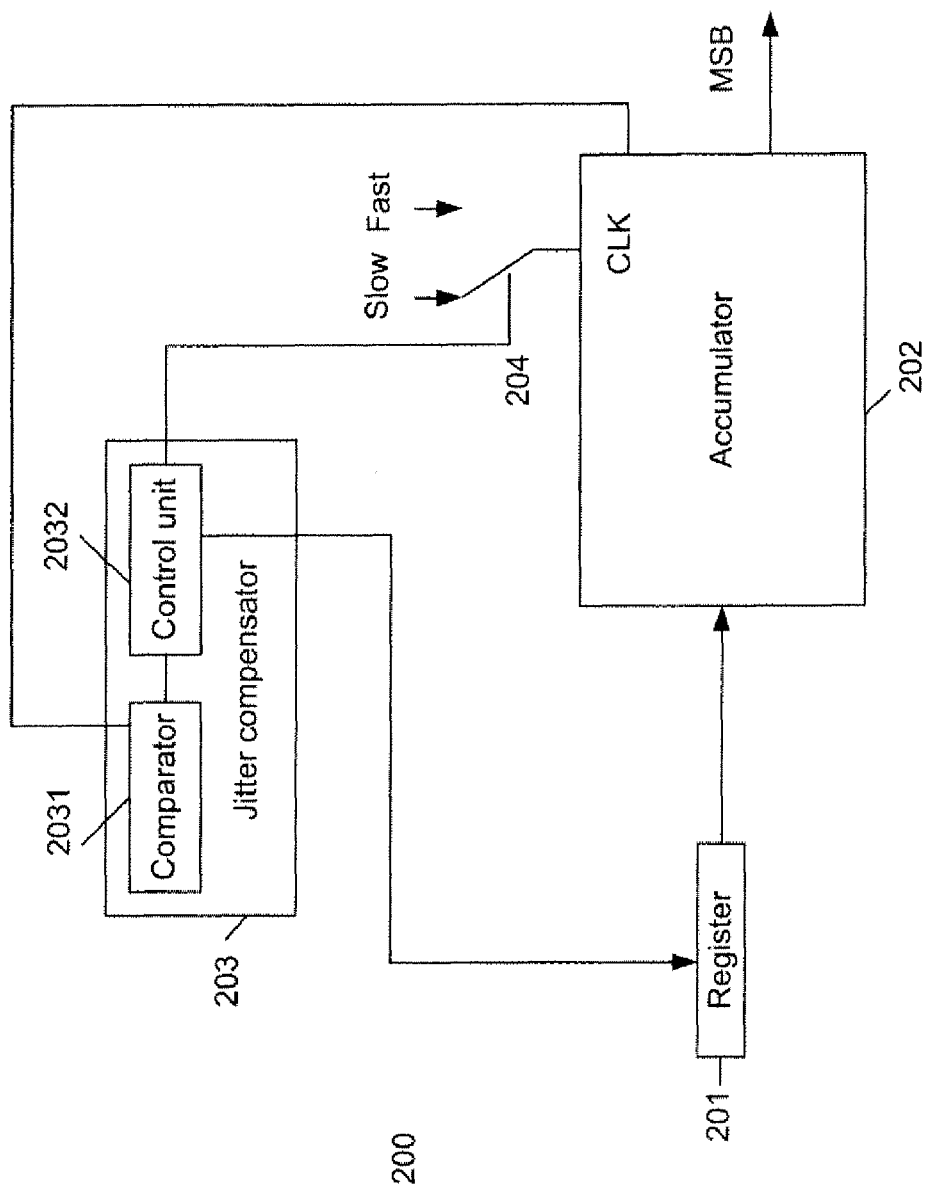
FIG. 2 illustrates a jitter compensated NCO according to one embodiment of the present invention.

FIG. 2 illustrates a jitter compensated NCO according to one embodiment of the present invention. As shown, a register 201 may provide a step value to an accumulator 202 at its input. The step value for a target frequency may be determined using the Equation (1).

In one embodiment, the accumulator 202 may have 5 bits and have a maximum value of 31. It may receive an input clock at a terminal CLK. At the rising edge of a pulse of the input clock, the accumulator 202 may be incremented by the step value from the register 201. When the accumulator value exceeds a MSB threshold, the MSB value of the accumulator 202 may become binary 1. When the accumulator value exceeds the accumulator maximum value 31, the MSB value of the accumulator 202 may return to binary 0. Unless the input clock can be divided evenly, there will be some remainder left in the accumulator 202. The remainder may come back to zero after a number of iterations, and the number of iterations may depend on the clock used. Whenever there is remainder left in the accumulator 202, there will be a small amount of jitter in the output clock.

A jitter compensator 203 may be used to compensate for NCO jitter. The jitter compensator 203 may have a comparator 2031, and a control unit 2032. The comparator 2031 may monitor the accumulator value. The difference between the accumulator value and the MSB threshold (e.g., 0x80_0000) and the difference between the accumulator value and the accumulator maximum value (e.g., 0xFF_FFFF) may represent how far in real time the current NCO clock edge is from the ideal clock edge, since ideal clock edges toggle exactly at 0x80_0000 and 0xFF_FFFF.

In one embodiment, when the remainder, which is the difference between the accumulator value and the accumulator maximum value, is smaller than the step value 9, the control unit 2032 may decide that the input clock may no longer have enough resolution to accurately generate an ideal clock edge. The control unit 2032 may control a switch 204 to change the input clock from a slow clock to a faster clock, e.g., 4 MHz, to finish off the accumulator. In particular, a compensating step value may be calculated according to the Equation (1), using the faster clock as the input clock:

$$\text{Compensating step value} = 32*3.2\,k/4\,M \approx 0.0256$$

The faster clock and the compensating step value may be applied to the accumulator 202 to zero out the remainder quickly. Once the ideal clock edge is reached, the control unit 2032 may switch the step value back to the previously used less accurate step value 9.

Figure 1A:
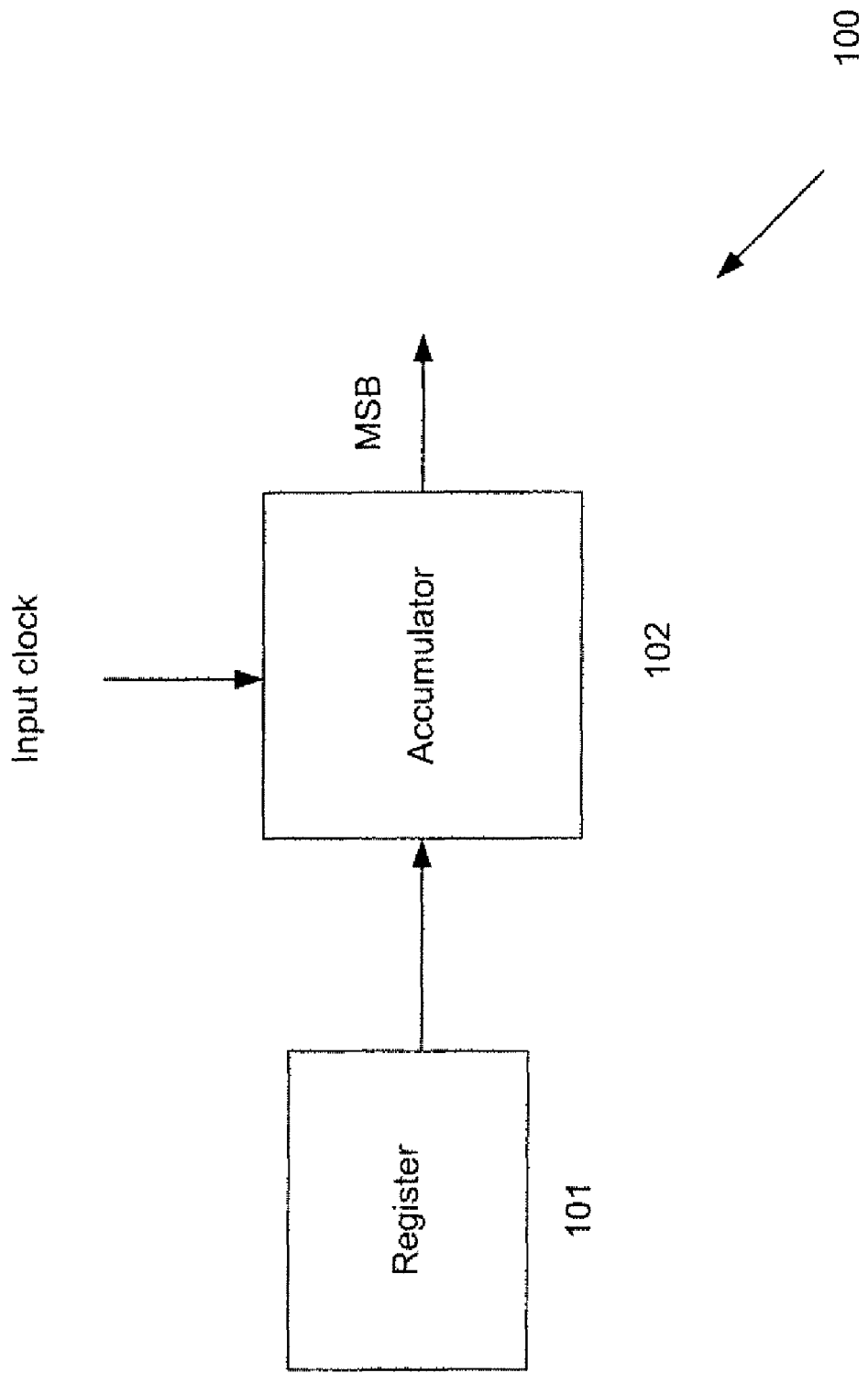
FIG. 1A illustrates a prior art NCO.
Figure 1B:
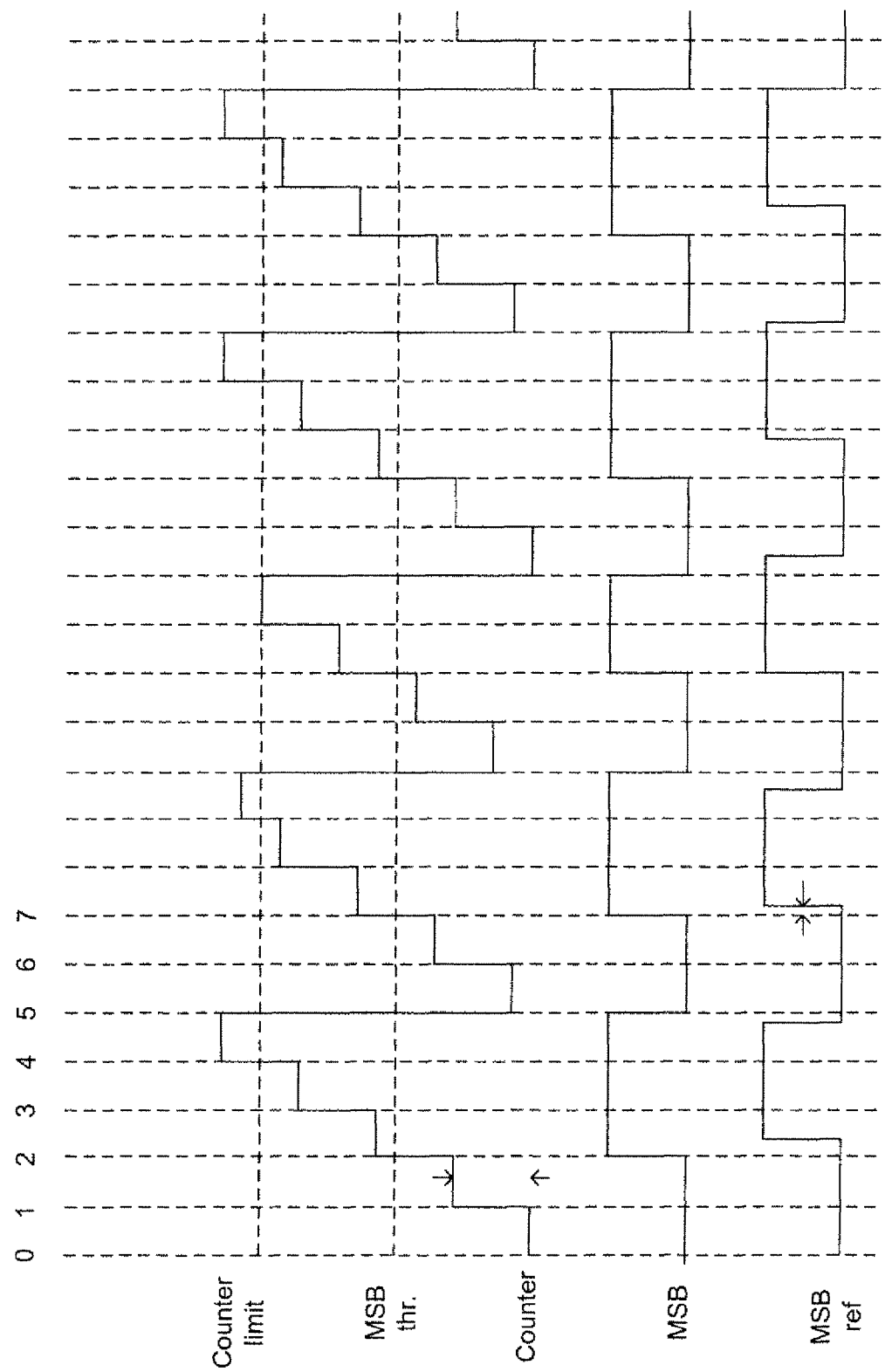
FIG. 1B illustrates a signal timing reference chart of a prior art NCO.
Figure 3:
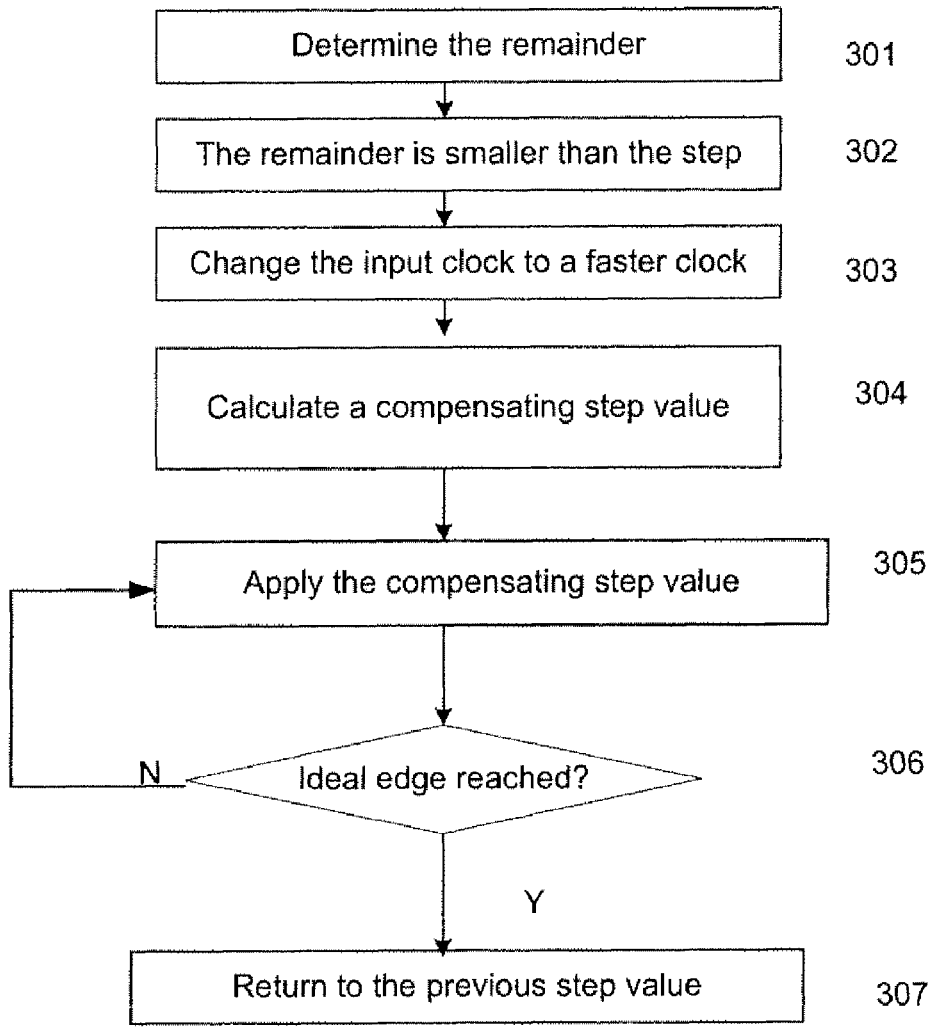
FIG. 3 illustrates a flowchart of a method for compensating NCO jitter according to one embodiment of the present invention.

FIG. 3 illustrates a flowchart of a method for compensating NCO jitter according to one embodiment of the present invention. The method may be used in the NCO shown in FIG. 2. The method may start just after time 5 in FIG. 1B, when the step value in the register 201 is 9, the accumulator 202 receives a slow clock and has a value 36.

At 301, the comparator 2031 may look at the accumulator value, and compare it with the 0xFF_FFFF value, which is, e.g., 31. The comparator 2031 may determine that the difference, or the remainder, is 5.

At 302, the control unit 2032 may decide that the remainder is smaller than the step value 9, and the input clock may no longer have enough resolution to accurately generate an ideal clock edge.

At 303, the control unit 2032 may replace the input clock with a faster clock, e.g., 4 MHz.

At 304, a compensating step value may be calculated according to Equation (1), using the faster clock as the input clock:

$$\text{Compensating step value} = 32*3.2\,k/4\,M \approx 0.0256$$

At 305, the compensating step value may be stored to the register 201 and used to compensate for the jitter.

At 306, it may be decided whether the ideal clock edge has been reached. If not, the process may return to 305.

If the ideal clock edge has been reached, at 307, the control unit 2032 may switch the compensate step value back to the previously used less accurate step value 9 and may switch back to the slow input clock. With the jitter compensation, at time 6, the step value in the register 201 is 9, and the accumulator value is binary zero.

In one embodiment, instead of calculating a compensating step value, the control unit 2032 may subtract a programmed amount from the remainder at a pulse of the fast clock, e.g., 1 in each pulse, until the ideal clock edge is reached after 5 cycles.

Figure 4:
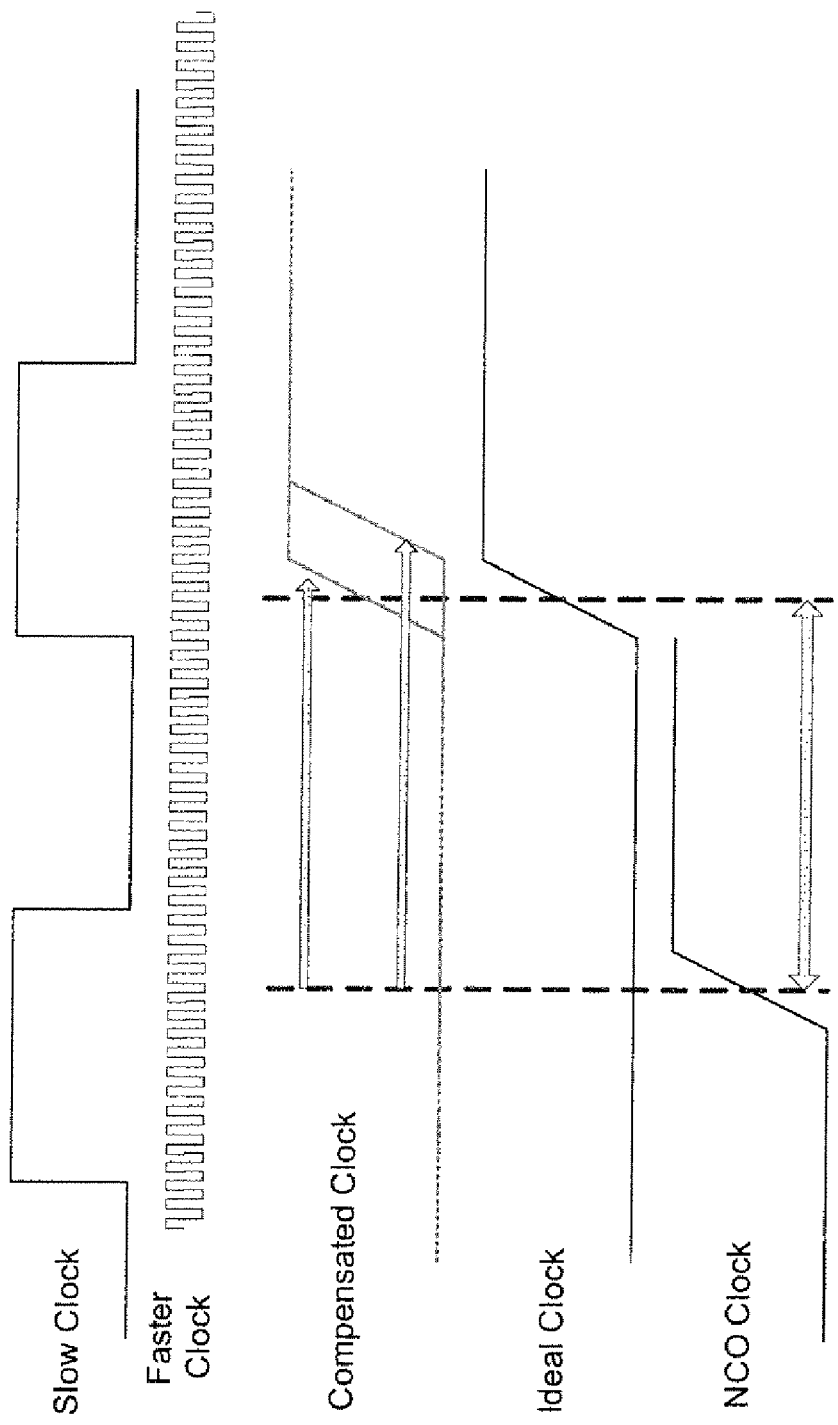
FIG. 4 illustrates signals involved in a method for compensating NCO jitter according to one embodiment of the present invention.

FIG. 4 illustrates signals involved in a method for reducing NCO jitter according to one embodiment of the present invention. As shown, the faster clock may have a considerably higher frequency than the slow clock, and the compensated clock is much closer to the ideal clock edge than the uncompensated clock is.

Figure 5:
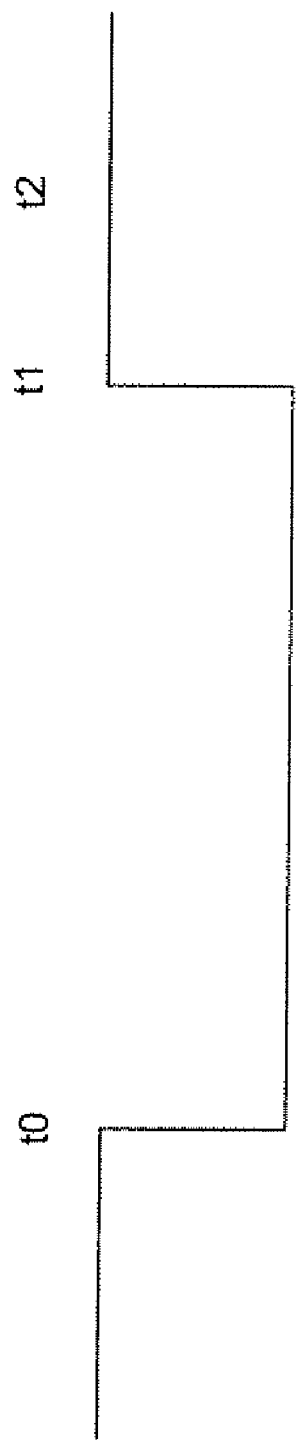
FIG. 5 illustrates a method for compensating NCO jitter in a Bluetooth™ device according to one embodiment of the present invention.

FIG. 5 illustrates a method for reducing NCO jitter in a Bluetooth™ device according to one embodiment of the present invention. As shown, a Bluetooth™ device may enter a sleep mode at time t0, and wake up at time t2. A faster system clock, e.g., 4 MHz, may be replaced by a slow system clock at t0, and then may resume at time t1 Between time t0 and t1, the NCO 200 may work with the slow system clock and its output may have jitter. Since the system needs to wake up precisely at time t2, jitter needs to be compensated before t2. When the faster system clock becomes available at time t1, the NCO may use the method shown in FIG. 3 to compensate jitter, replacing the slow system clock with the faster system clock at 4 MHz.

It should be noted that, while various exemplary values of a slow clock and a faster clock have been provided, it is necessary only that the faster clock be sufficiently faster than the slow clock to be able to compensate for the jitter. The speed of the faster clock may depend, for example, on the speed of the slow clock, the number of bits in the accumulator, and/or some combination of the two. In one embodiment, the frequency of the faster clock may be about 4 times of that of the slow clock.

In the embodiments shown in FIGS. 2-4, the compensated clock is closer to the current edge of the ideal clock. However, it may be necessary to monitor the remainder at every input clock pulse to decide how close the output may be to the current edge of the ideal clock, and to compensate for inaccuracy at each input clock pulse to align the output to the current edge of the ideal clock. In order to accomplish these things, additional hardware and/or software may be required to do the subtraction and comparison. In an alternative approach, instead of monitoring the remainder, the compensation scheme may work on a delayed version of the ideal clock, generating a compensated NCO close to the next edge of the ideal clock rather than the current edge. The delay might not noticeably affect the output of the NCO, since it is just an offset shift and the frequency does not change.

Figure 6:
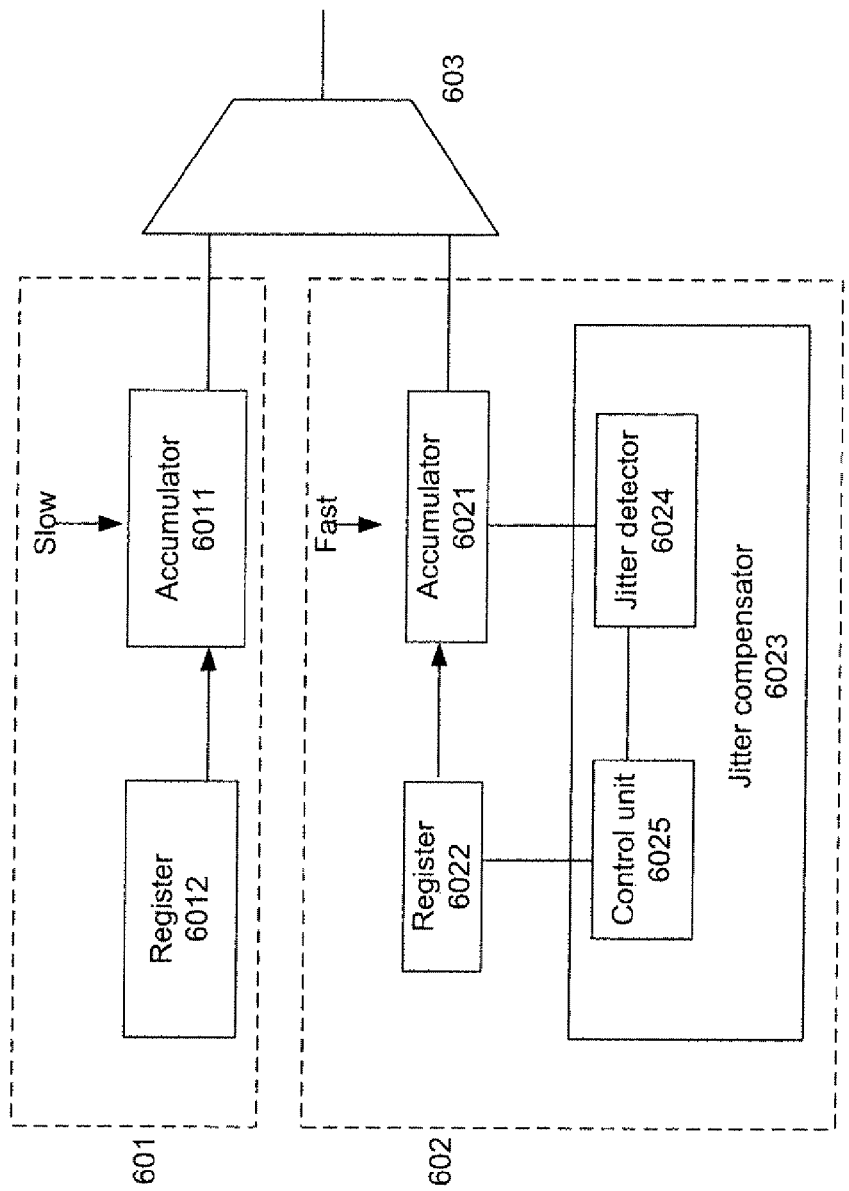
FIG. 6 illustrates a jitter compensated NCO according to one embodiment of the present invention.
Figure 7:
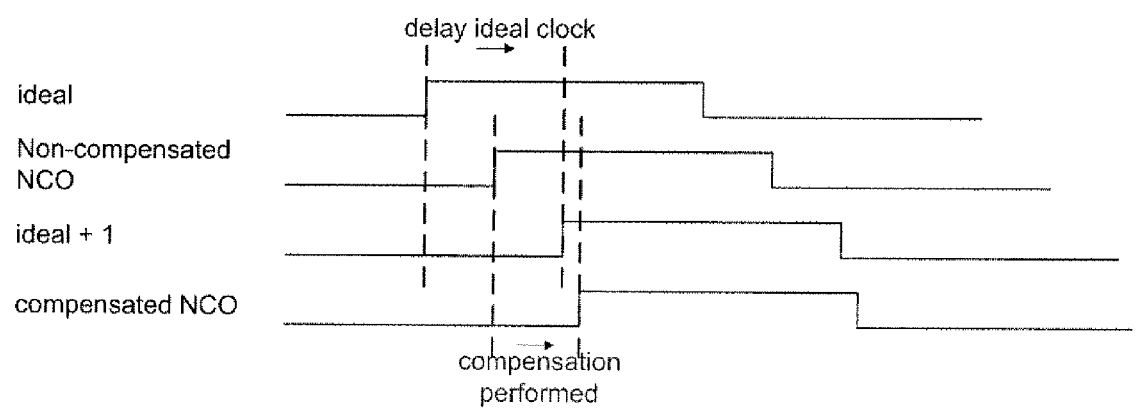
FIG. 7 illustrates signals in the jitter compensated NCO of FIG. 6.

FIG. 6 illustrates a jitter compensated NCO according to one embodiment of the present invention, and FIG. 7 illustrates signals in the jitter compensated NCO of FIG. 6. As shown, the NCO 600 may have a non-compensated clock section 601 for generating a non-compensated clock and a compensated clock section 602 for generating a compensated clock. The non-compensated clock section 601 may have a first accumulator 6011, which may receive a slow clock at its terminal CLK and a step value for the slow clock from a register 6012, and generate the non-compensated clock. The non-compensated clock may be constantly generated when the slow clock is available.

The compensated clock section 602 may have a second accumulator 6021, which may receive a fast clock at its terminal CLK and a step value for the fast clock from a register 6022, and generate the compensated clock. The compensated clock section 602 may be automatically turned on when the fast clock is available.

A jitter compensator 6023 may include a jitter detector 6024 and a control unit 6025. Instead of monitoring the remainder in the accumulator at each input clock pulse, as the comparator 2031 in FIG. 2 does, the jitter detector 6024 may detect whether the current NCO output misses the current edge of an ideal clock. If yes, the control unit 6025 may set the step value in the register 6022 to a temporary compensating step value to move the next NCO output closer to the next edge of the ideal clock. The control unit 6025 may determine the number of input clock pulses to the next edge of the ideal clock and the difference between the current NCO output and the current edge of the ideal clock, and calculate a temporary compensating step value to zero out the difference during the input clock pulses. When the current NCO output is late, as shown in FIG. 7, the control unit 6025 may decrease the step value in the register 6022 so that the next NCO output may be pulled earlier and closer to the next edge of the ideal clock. When the current NCO output is earlier, the control unit 6025 may increase the step value in the register 6022 to push back the next NCO output.

The temporary compensating step may be pre-calculated and stored, and may be the ration of a slow clock divided by a fast clock. Alternatively, it may be calculated on the fly by counting the number of fast clocks for a period of the slow clock. The slow clock to be chosen may come from the one with the lowest remainder of accumulator, and may be a zero crossing.

One input terminal of a multiplexer 603 may receive the non-compensated clock from the non-compensated clock section 601, and the other input terminal may receive the compensated clock from the compensated clock section 602. When the compensated clock is available, the multiplexer 603 may output the compensated clock. Otherwise, it may output the non-compensated clock.

Figure 8:
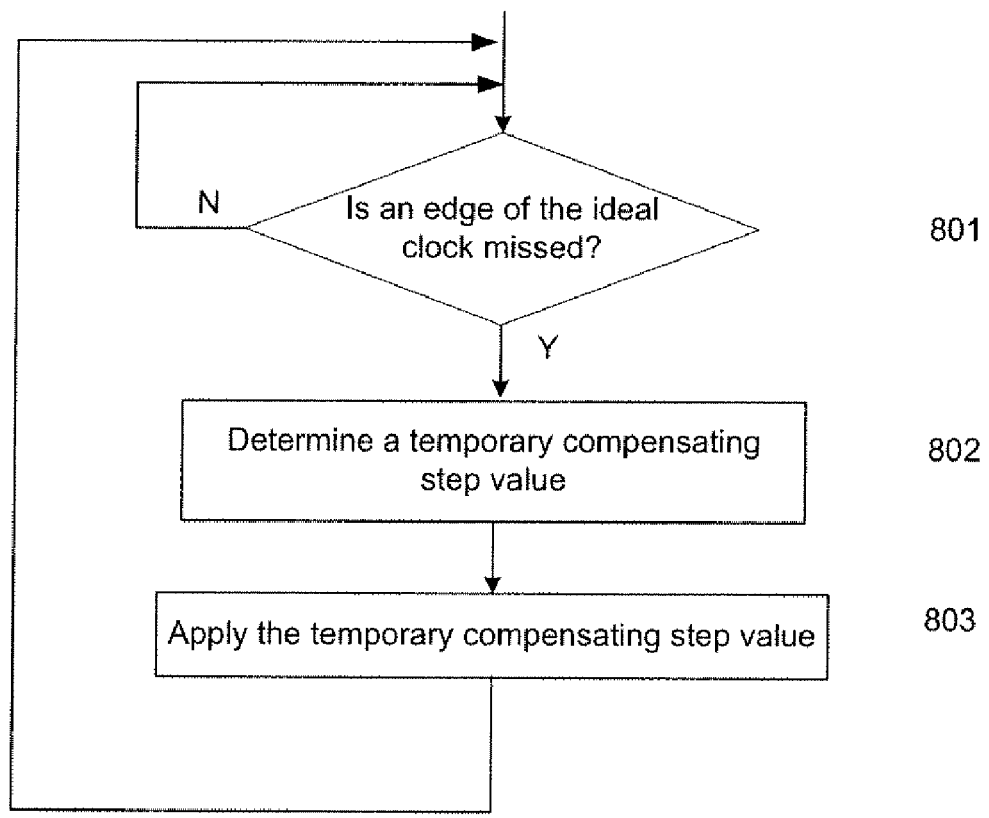
FIG. 8 illustrates a flowchart of a method for compensating NCO jitter according to one embodiment of the present invention.

FIG. 8 illustrates a flowchart of a method for compensating NCO jitter according to one embodiment of the present invention. The method may be used with the jitter compensated NCO in FIG. 6.

At 801, the jitter detector 6024 may determine whether the current NCO output misses the current edge of the ideal clock. If not, the jitter detector 6024 may wait to detect the next NCO output.

If the current NCO output misses the current edge of the ideal clock, at 802, the control unit 6025 may determine a temporary compensating step value according to the number of input clock pulses to the next edge of the ideal clock and the difference between the current NCO and the current edge of the ideal clock, and write the value to the register 6022.

At 803, the temporary compensating step value may be applied to the accumulator 6021, and the process may return to 801.

Several features and aspects of the present invention have been illustrated and described in detail with reference to particular embodiments by way of example only, and not by way of limitation. Alternative implementations and various modifications to the disclosed embodiments are within the scope and contemplation of the present disclosure. Therefore, it is intended that the invention be considered as limited only by the scope of the appended claims.

What is claimed is:

1. A method for compensating jitter in a numerically controlled oscillator (NCO), the method comprising:
   receiving, at a first accumulator in the NCO, a first input clock and a first step value corresponding to the first input clock;
   receiving, at a second accumulator in the NCO, a second input clock and a second step value corresponding to the second input clock; and
   generating a temporary step value, and, if jitter is detected, applying to the NCO said temporary step value instead of said second step value to reduce jitter in the NCO.

2. The method of claim 1, wherein said generating comprises calculating and prestoring said temporary step value as a ratio of said first step value to said second step value, or calculating said temporary step value, as a ratio of said first step value to said second step value, in real time.

3. The method of claim 1, further comprising performing said applying if a current output of the NCO misses a current edge of an ideal clock.

4. The method of claim 3, wherein said applying aligns a next output of the NCO with a next edge of the ideal clock.

5. The method of claim 3, further comprising: if the current output of the NCO does not miss the current edge of the ideal clock, waiting to detect a next output of the NCO, and if the next output of the NCO misses a next edge of the ideal clock, performing said applying.

6. The method of claim 2, further comprising performing said applying if a current output of the NCO misses a current edge of an ideal clock.

7. The method of claim 6, wherein said applying aligns a next output of the NCO with a next edge of the ideal clock.

8. The method of claim 6, further comprising: if the current output of the NCO does not miss the current edge of the ideal clock, waiting to detect a next output of the NCO, and if the next output of the NCO misses a next edge of the ideal clock, performing said applying.

9. A jitter compensated numerically controlled oscillator (NCO), comprising:
   a first clock section comprising a first memory for storing a first step value for a first input clock, and a first accumulator receiving said first step value;
   a second clock section comprising a second memory for storing a second step value for a second, faster input clock, and a second accumulator receiving said second step value;
   a jitter compensator comprising a jitter detector to detect jitter, and a control unit, to generate a temporary step value and, in response to detection of jitter, apply said temporary step value to the NCO instead of said second step value to reduce jitter in the NCO.

10. The NCO of claim 9, wherein the control unit calculates and prestores said temporary step value as a ratio of said first step value divided by said second step value, or calculates said temporary step value as a ratio of said first step value, divided by said second step value, in real time.

11. The NCO of claim 9, wherein the control unit applies said temporary step value to align a next output of the NCO with a next edge of an ideal clock.

12. The NCO of claim 11, wherein, if the jitter detector determines that a current output of the NCO misses a current edge of the ideal clock, said control unit applies said temporary step value instead of said second step value.

13. The NCO of claim 11, wherein, if a current output of the NCO does not miss a current edge of the ideal clock, waiting to detect a next output of the NCO, and if the next output of the NCO misses the next edge of the ideal clock, performing said applying.

14. The NCO of claim 10, wherein the control unit applies said temporary step value to align a next output of the NCO with a next edge of an ideal clock.

15. The NCO of claim 14, wherein, if the jitter detector determines that a current output of the NCO misses a current edge of the ideal clock, said control unit applies said temporary step value instead of said second step value.

16. The NCO of claim 14, wherein, if a current output of the NCO does not miss a current edge of the ideal dock, waiting to detect a next output of the NCO, and if the next output of the NCO misses the next edge of the ideal clock, performing said applying.

* * * * *